US012804875B2

(12) United States Patent
Giterman et al.

(10) Patent No.: US 12,804,875 B2
(45) Date of Patent: Nov. 17, 2026

(54) COMPACT GAIN CELL

(71) Applicant: Raaam Memory Technologies Ltd, Petach Tikva (IL)

(72) Inventors: Robert Giterman, Petach Tikva (IL); Andreas Burg, Ecublens (CH); Andac Yigit, Ecublens (CH)

(73) Assignee: Raaam Memory Technologies Ltd, Petach Tikva (IL)

( * ) Notice: Subject to any disclaimer, the term of this patent is extended or adjusted under 35 U.S.C. 154(b) by 223 days.

(21) Appl. No.: 18/637,652

(22) Filed: Apr. 17, 2024

(65) Prior Publication Data

US 2025/0331152 A1 Oct. 23, 2025

(51) Int. Cl.

| | |
|---|---|
| ***G11C 11/4096*** | (2006.01) |
| ***G11C 11/405*** | (2006.01) |
| ***H10B 12/00*** | (2023.01) |

(52) U.S. Cl.

CPC ............ *H10B 12/00* (2023.02); *G11C 11/405* (2013.01); *G11C 11/4096* (2013.01)

(58) Field of Classification Search

CPC .......................... G11C 11/405; G11C 11/4096

USPC .......................................................... 365/184

See application file for complete search history.

(56) References Cited

U.S. PATENT DOCUMENTS

| | | | | |
|---|---|---|---|---|
| 4,989,055 | A * | 1/1991 | Redwine | H10B 12/00 257/302 |
| 7,196,923 | B1 | 3/2007 | Hong et al. | |
| 9,342,650 | B2 | 5/2016 | Liaw | |
| 10,763,267 | B2 | 9/2020 | Chong et al. | |
| 11,068,639 | B2 | 7/2021 | Frederick, Jr. et al. | |
| 11,342,337 | B2 | 5/2022 | Liaw | |
| 2023/0164971 | A1 * | 5/2023 | Wang | G11C 11/412 365/154 |
| 2025/0273261 | A1 * | 8/2025 | Chung | G11C 11/4096 |
| 2025/0285672 | A1 * | 9/2025 | Giterman | G11C 11/405 |
| 2025/0292826 | A1 * | 9/2025 | Aoki | G11C 11/4096 |

FOREIGN PATENT DOCUMENTS

| | | | |
|---|---|---|---|
| KR | 102067835 | B1 | 1/2020 |

OTHER PUBLICATIONS

Levy Einat, et al. "4T Gain-Cell Providing Unlimited Availability through Hidden Refresh with 1W1R Functionality." EnICS Labs, Faculty of Engineering, Bar-Ilan University, Ramat Gan, Israel. 2021 IEEE International Symposium on Circuits and Systems (ISCAS), Daegu, Korea, 2021, pp. 1-4, doi: 10.1109/ISCAS51556.2021.9401416.

(Continued)

*Primary Examiner* — Connie C Yoha

(74) *Attorney, Agent, or Firm* — The Roy Gross Law Firm, LLC; Roy Gross

(57) ABSTRACT

A gain cell for storing a data level includes a write element and a read element. The write element is connected to a write word line (WWL) and a bit line (BL), and is configured to write a logic level from the BL to a storage node of the gain cell when a write operation is triggered on the WWL. The write element includes at least one transistor. The read element is connected to a read word line (RWL) and the bit line (BL), and is configured to read a logic level from the storage node to the BL when a read operation is triggered on the RWL. The read element includes at least one transistor.

24 Claims, 16 Drawing Sheets

(56) References Cited

OTHER PUBLICATIONS

Xie, S., Ni, C., Sayal, A., Jain, P., Hamzaoglu, F., & Kulkarni, J. P. (Feb. 2021) 16.2 eDRAM-CIM: Compute-in-memory design with reconfigurable embedded-dynamic-memory array realizing adaptive data converters and charge-domain computing. 248-250. 2021 IEEE International Solid-State Circuits Conference. doi: 10.1109/ISSCC42613.2021.9365932.

Harel, O., Casarrubias, E. N., Eggimann, M., Gurkaynak, F., Benini, L., Teman, A., . . . & Burg, A. (2022). 64-kB 65-nm GC-eDRAM with half-select support and parallel refresh technique. IEEE Solid-State Circuits Letters, 5, 170-173. 2022, doi: 10.1109/LSSC.2022.3182531.

Rajaei, R., Lin, Y. K., Salahuddin, S., Niemier, M., & Hu, X. S. (Aug. 2020). GC-eDRAM design using hybrid FinFET/NC-FinFET. In Proceedings of the ACM/IEEE International Symposium on Low Power Electronics and Design (pp. 199-204). https://doi.org/10.1145/3370748.3406568.

Giterman, R., Shalom, A., Burg, A., Fish, A., & Teman, A. (2020). A 1-Mbit fully logic-compatible 3T gain-cell embedded DRAM in 16-nm FinFET. IEEE Solid-State Circuits Letters, 3, 110-113. doi: 10.1109/LSSC.2020.3006496.

Song, J., Tang, X., Luo, H., Zhang, H., Qiao, X., Sun, Z., . . . & Huang, R. (2023). A 4-bit Calibration-Free Computing-In-Memory Macro With 3T1C Current-Programed Dynamic-Cascode Multi-Level-Cell eDRAM. IEEE Journal of Solid-State Circuits. vol. 59, No. 3, pp. 842-854, Mar. 2024, doi: 10.1109/JSSC.2023.3339887.

Giterman, R., Fish, A., Burg, A., & Teman, A. (2017). A 4-transistor nMOS-only logic-compatible gain-cell embedded DRAM with over 1.6-ms retention time at 700 mV in 28-nm FD-SOI. IEEE Transactions on Circuits and Systems I: Regular Papers, 65(4), 1245-1256.Apr. 2018, doi: 10.1109/TCSI.2017.2747087.

Maltabashi, O., Marinberg, H., Giterman, R., & Teman, A. (May 2018). A 5-transistor ternary gain-cell eDRAM with parallel sensing. In 2018 IEEE International Symposium on Circuits and Systems (ISCAS) (pp. 1-5). Florence, Italy, 2018, pp. 1-5, doi: 10.1109/ISCAS.2018.8351360.

Shalom, A., Fish, A., & Teman, A. (Oct. 2019). A 9pW/bit 400mV 3T Gain-Cell eDRAM for ULP Applications in 28 nm FD-SOI. In 2019 IEEE SOI-3DSubthreshold Microelectronics Technology Unified Conference (S3S) (pp. 1-2). San Jose, CA, USA, 2019, pp. 1-2, doi: 10.1109/S3S46989.2019.9320704.

Giterman, R., Teman, A., & Fish, A. (Oct. 2017). A 11.5 pW/bit 400mV 5T gain-cell eDRAM for ULP applications in 28nm FD-SOI. In 2017 IEEE SOI-3DSubthreshold Microelectronics Technology Unified Conference (S3S) (pp. 1-3). Burlingame, CA, USA, 2017, pp. 1-3, doi: 10.1109/S3S.2017.8308757.

Giterman, R., Teman, A., & Fish, A. (Oct. 2018). A 14.3 pW sub-threshold 2T gain-cell eDRAM for ultra-low power IoT applications in 28nm FD-SOI. In 2018 IEEE SOI-3D-Subthreshold Microelectronics Technology Unified Conference (S3S) (pp. 1-2). IEEE. Burlingame, CA, USA, 2018, pp. 1-2, doi: 10.1109/S3S.2018.8640130.

Narinx, J., Giterman, R., Bonetti, A., Frigerio, N., Aprile, C., Burg, A., & Leblebici, Y. (Nov. 2019). A 24 kb single-well mixed 3T gain-cell eDRAM with bodybias in 28 nm FD-SOI for refresh-free DSP applications. In 2019 IEEE Asian Solid-State Circuits Conference (A-SSCC) (pp. 219-222). doi: 10.1109/A-SSCC47793.2019.9056985.

Yigit, A., Casarrubias, E. N., Giterman, R., & Burg, A. (2022). A 128-kbit GCeDRAM With Negative Boosted Bootstrap Driver for 11.3× Lower-Refresh Frequency at a 2.5% Area Overhead in 28-nm FD-SOI. IEEE Solid-State Circuits Letters, 6, 13-16.

Song, J., Tang, X., Luo, H., Zhang, H., Qiao, X., Sun, Z., . . . & Huang, R. (Apr. 2023). A calibration-free 15-level/cell eDRAM computing-in-memory macro with 3T1C current-programmed dynamic-cascoded MLC achieving 233-to-304-TOPS/W 4b MAC. In 2023 IEEE Custom Integrated Circuits Conference (CICC) (pp. 1-2). IEEE. doi: 10.1109/CICC57935.2023.10121207.

Jung, I. J., Jo, M., Ko, D. H., Lee, Y., & Jung, S. O. (2023). A Charge-Domain 4T2C eDRAM Compute-In-Memory Macro With Enhanced Variation Tolerance and Low-Overhead Data Conversion Schemes. IEEE Transactions on Circuits and Systems II: Express Briefs, vol. 71, No. 4, pp. 1824-1828, Apr. 2024, doi: 10.1109/TCSII.2023.3332749.

Yu, C., Yoo, T., Kim, H., Kim, T. T. H., Chuan, K. C. T., & Kim, B. (2020). A logic-compatible eDRAM compute-in-memory with embedded ADCs for processing neural networks. IEEE Transactions on Circuits and Systems I: Regular Papers, 68(2), 667-679. doi: 10.1109/TCSI.2020.3036209.

Giterman, R., Fish, A., Geuli, N., Mentovich, E., Burg, A., & Teman, A. (Sep. 2017). An 800 Mhz mixed-V T 4T gain-cell embedded DRAM in 28 nm CMOS bulk process for approximate computing applications. In ESSCIRC 2017—43rd IEEE European Solid State Circuits Conference (pp. 308-311). doi: 10.1109/ESSCIRC.2017.8094587.

Giterman, R., Fish, A., Geuli, N., Mentovich, E., Burg, A., & Teman, A. (2018). An 800-MHz Mixed-Vt 4T IFGC Embedded DRAM in 28-nm CMOS Bulk Process for Approximate Storage Applications. IEEE Journal of Solid-State Circuits, 53(7), 2136-2148. doi: 10.1109/JSSC.2018.2820145.

Huang, T., Run, R., Hu, Y., Yin, L., Pan, L., Li, G., & Xie, X. (Oct. 2023). An Energy-Efficient Gain-Cell Embedded DRAM Design with Weight Encoding for CNN Applications. In 2023 IEEE International Conference on Integrated Circuits, Technologies and Applications (ICTA) (pp. 1-2). IEEE. DOI: 10.1109/ICTA60488.2023.10364265.

Raman, S. R. S., Xie, S., & Kulkarni, J. P. (May 2021). Compute-in-eDRAM with backend integrated indium gallium zinc oxide transistors. In 2021 IEEE International Symposium on Circuits and Systems (ISCAS) (pp. 1-5). IEEE. doi: 10.1109/ISCAS51556.2021.9401798.

Golman, R., Giterman, R., & Teman, A. (Dec. 2018). Configurable multi-port dynamic bitcell with internal refresh mechanism. In 2018 25th IEEE International Conference on Electronics, Circuits and Systems (ICECS) (pp. 589-592). IEEE. doi: 10.1109/ICECS.2018.8617861.

Saligram, R., Datta, S., & Raychowdhury, A. (Apr. 2021). CryoMem: A 4K-300K 1.3 GHZ eDRAM macro with hybrid 2T-gain-cell in a 28nm logic process for cryogenic applications. In 2021 IEEE Custom Integrated Circuits Conference (CICC) (pp. 1-2). IEEE. doi: 10.1109/CICC51472.2021.9431527.

Saligram, R., Datta, S., & Raychowdhury, A. (2021). CryoMem: A 4-300-K 1.3-GHz hybrid 2T-gain-cell-based eDRAM macro in 28-nm logic process for cryogenic applications. IEEE Solid-State Circuits Letters , 4 , 194-197. doi: 10.1109/LSSC.2021.3123866.

Shu, Y., Zhang, H., Sun, H., Deng, Q., & Ha, Y. (May 2023). CSDB-eDRAM: A 16Kb Energy-Efficient 4T CSDB Gain Cell eDRAM with over 16.6 s Retention Time and 49.23 uW/Kb at 4.2 K for Cryogenic Computing. In 2023 IEEE International Symposium on Circuits and Systems (ISCAS) (pp. 1-5). IEEE. DOI:10.1109/ISCAS46773.2023.10181628.

Giterman, R., Bonetti, A., Bravo, E. V., Noy, T., Teman, A., & Burg, A. (2020). Current-based data-retention-time characterization of gain-cell embedded DRAMs across the design and variations space. IEEE Transactions on Circuits and Systems I: Regular Papers , 67 (4), 1207-1217. doi: 10.1109/TCSI.2020.2971695.

Soo, S. R., Hamzah, A., Alias, N. E., Kamisian, I., Tan, M. L. P., Isaak, S., &Johari, Z. (Oct. 2021). Design of Low Power Gain-Cell eDRAM for 4Kb Memory Array in 130nm CMOS. In 2021 International Conference on Electrical Engineering and Informatics (ICEEI) (pp. 1-6). IEEE. doi: 10.1109/ICEEI52609.2021.9611107.

Ye, H., Gomez, J., Chakraborty, W., Spetalnick, S., Dutta, S., Ni, K., . . . & Datta, S. (Dec. 2020). Double-gate W-doped amorphous indium oxide transistors for monolithic 3D capacitorless gain cell eDRAM. In 2020 IEEE International Electron Devices Meeting (IEDM) (pp. 28-3). IEEE. doi: 10.1109/IEDM13553.2020.9371981.

Kim, S., Li, Z., Um, S., Jo, W., Ha, S., Lee, J., . . . & Yoo, H. J. (2023). DynaPlasia: An eDRAM In-Memory Computing-Based Reconfigurable Spatial Accelerator With Triple-Mode Cell. IEEE Journal of Solid-State Circuits. (ISSCC), San Francisco, CA, USA, 2023, pp. 256-258, doi: 10.1109/ISSCC42615.2023.10067352.

(56) References Cited

OTHER PUBLICATIONS

Xie, S., Ni, C., Jain, P., Hamzaoglu, F., & Kulkarni, J. P. (Jun. 2022). Gain-cell CIM: Leakage and bitline swing aware 2T1C gain-cell eDRAM compute in memory design with bitline precharge DACs and compact Schmitt trigger ADCs. In 2022 IEEE Symposium on VLSI Technology and Circuits (VLSI Technology and Circuits) (pp. 112-113). doi: 10.1109/VLSITechnologyandCir46769.2022.9830338.

Garzón, E., Greenblatt, Y., Harel, O., Lanuzza, M., & Teman, A. (2021). Gain-cell embedded DRAM under cryogenic operation—A first study. IEEE Transactions on Very Large Scale Integration (VLSI) Systems, 29(7), 1319-1324. doi: 10.1109/TVLSI.2021.3081043.

Bonetti, A., Golman, R., Giterman, R., Teman, A., & Burg, A. (2020). Gain-cell embedded DRAMs: Modeling and design space. IEEE Transactions on Very Large Scale Integration (VLSI) Systems , 28 (3), 646-659. doi: 10.1109/TVLSI.2019.2955933.

Giterman, R., Bonetti, A., Burg, A., & Teman, A. (2019). GC-eDRAM with bodybias compensated readout and error detection in 28-nm FD-SOI. IEEE Transactions on Circuits and Systems II: Express Briefs , 66 (12), 2042-2046. doi: 10.1109/TCSII.2019.2896164.

Shalom, A., Giterman, R., & Teman, A. (Dec. 2018). High density GCeDRAM design in 16nm FinFET. In 2018 25th IEEE International Conference on Electronics, Circuits and Systems (ICECS) (pp. 585-588). IEEE. DOI:10.1109/ICECS.2018.8618019.

Liu, S., Li, S., Lin, Q., Jana, K., Mitra, S., Wong, H. S. P., & Toprasertpong, K. (2023). Hybrid 2T nMOS/pMOS Gain Cell Memory with Indium-tin-oxide and Carbon Nanotube MOSFETs for Counteracting Capacitive Coupling. IEEE Electron Device Letters. PP(99):1-1. DOI:10.1109/LED.2023.3344370.

Giterman, R., Teman, A., & Meinerzhagen, P. (2017). Hybrid GC-eDRAM/SRAM bitcell for robust low-power operation. IEEE Transactions on Circuits and Systems II: Express Briefs, 64(12), 1362-1366. doi: 10.1109/TCSII.2017.2768102.

Golman, R., Giterman, R., Harel, O., & Teman, A. (Oct. 2020). Improved Read Access in GC-eDRAM Memory by Dual-Negative Word-Line Technique. In 2020 IEEE International Symposium on Circuits and Systems (ISCAS) (pp. 1-5). IEEE. doi: 10.1109/ISCAS45731.2020.9180875.

Lee, W. G., & Chae, J. H. (Jun. 2023). Improvement of Data Retention Time in Gain-Cell Embedded DRAM Using MOMCAP. In 2023 International Technical Conference on Circuits/Systems, Computers, and Communications (ITCCSCC) (pp. 1-5). IEEE. doi: 10.1109/ITC-CSCC58803.2023.10212649.

* cited by examiner

COMPACT GAIN CELL

TECHNICAL FIELD

The present disclosure, in some embodiments, thereof, relates to a gain cell and, more particularly, but not exclusively, to a non-planar gain cell.

BACKGROUND

Modern industry growth drivers, such as Artificial Intelligence (AI) and Machine Learning, 5G, Internet-of-Things (IOT) and automotive technologies require ever-increasing amounts of memory. However, off-chip accesses to external dynamic random access memory (DRAM) are up to one thousand times more costly in latency and power than access to on-chip memory. To limit this performance and power overhead, the amount of embedded memory on almost any integrated circuit (i.e. chip) often reaches tens to hundreds of megabits, accounting often for up-to 75% of the total chip area. Unfortunately, the cost of silicon is proportional to its area, especially in high volume manufacturing. With SRAM IP dominating the die area, any density improvement in memory may significantly reduce the overall cost of the silicon. To make things worse, SRAM scaling beyond 16 nm process technologies has been facing significant scaling difficulties, leading to only 5%-20% reduced size between technology generations, as compared to 50% reduction in logic scaling. This further aggravates the memory bottleneck and significantly limits today's application from reaching their performance and power efficiency potentials.

1T-1C embedded DRAM (eDRAM) is a traditional alternative to SRAM due to its higher density. However, it requires additional complex and costly process steps to fabricate the memory bitcell. Moreover, process scaling resulted in serious reliability issues in its fabrication, hence it is only available in very few and expensive process nodes and it is phased out beyond 14 nm.

Gain-cell RAM (GCRAM) is a fully logic-compatible alternative to SRAM and to 1T-1C eDRAM, offering a smaller bitcell size than SRAM, nondestructive read operation (as opposed to 1T-1C eDRAM), and inherent two-ported functionality.

SUMMARY OF THE INVENTION

According to some embodiments there is provided a gain cell with a single bitline for read and write operations, a method for storing data in the gain cell, and a memory array of the gain cells.

Gain cells are a crucial component in many types of memory technologies and are designed to store a single bit of digital information. A gain cell includes interconnected transistors, which are configured to store charge in a storage node within the gain cell (typically at the junction between two or more of the transistors). Typically, data is written to and read from the gain cell by applying a trigger signal to the Write Word Line (WWL) and Read Word Line (RWL) respectively.

According to some embodiments disclosed herein, the gain cell includes a single bit line, which is used both to write data to the gain cell and to read data from the gain cell. Data may be written to the gain cell by applying a logic level to the bit line and applying a trigger signal to WWL. Data may be read from the gain cell applying a trigger signal to RWL and reading the gain cell output at the same bit line.

Some embodiments of the present disclosure may provide reduced gain cell area relative to cells with separate read and write bit lines, leading to increased density of a memory array formed from the gain cells.

According to a first aspect of some embodiments of the present disclosure there is provided gain cell for storing a data level. The gain cell includes a write element which includes at least one transistor and a read element which includes at least one transistor. The write element is connected to a write word line (WWL) and a bit line (BL), and is configured to write a logic level from the BL to a storage node of the gain cell when a write operation is triggered on the WWL. The read element is connected to a read word line (RWL) and the bit line (BL), and is configured to read a logic level from the storage node to the BL when a read operation is triggered on the RWL.

According to some embodiments of the present disclosure, a driver is connected to the BL. The driver is configured for setting the BL to the logic level prior to a write operation and for presetting a level of the BL to a preset level prior to a read operation.

According to some embodiments of the present disclosure, the BL is connected to a diffusion of at least one transistor of the write element and to a diffusion of at least one transistor of the read element.

According to some embodiments of the present disclosure, the WWL is connected to a gate of at least one transistor of the write element.

According to some embodiments of the present disclosure, the RWL is connected to a gate of at least one transistor of the read element.

According to some embodiments of the present disclosure, the RWL is connected to a diffusion of at least one transistor of the read element.

According to some embodiments of the present disclosure, the gain cell write element includes a write transistor and the read element includes a storage transistor and a read transistor. The write transistor has a first diffusion connected to the BL, a gate connected to the WWL and a second diffusion connected to the storage node. The storage transistor has a gate connected to the storage node, a first diffusion connected to a reference voltage, and a second diffusion. The read transistor has a gate connected to the RWL, a first diffusion connected to the second diffusion of the storage transistor, and a second diffusion connected to the BL.

According to some embodiments of the present disclosure, at least one transistor of the write element and at least one transistor of the read element are field-effect transistors (FETs).

According to some embodiments of the present disclosure, at least one transistor of the write element and at least one transistor of the read element are non-planar transistors.

According to some embodiments of the present disclosure, the BL is connected to the write element and to the read element by a single wire on an interconnect layer of the gain cell.

According to some embodiments of the present disclosure, the BL is connected to a diffusion of at least one transistor of the write element and to a diffusion of at least one transistor of the read element by a single wire on an interconnect layer of the gain cell.

According to some embodiments of the present disclosure, the gain cell includes at least one layer of material connected to the SN, wherein the at least one layer increases the capacitance of the storage node.

According to a second aspect of some embodiments of the present disclosure there is provided a method of storing data in a gain cell. The gain cell includes a write element which includes at least one transistor and a read element which includes at least one transistor. The write element is connected to a bitline (BL) and a write word line (WWL). The read element is connected to the bitline (BL) and a read word line (RWL). The write element and the read element are connected to create a storage node. The method includes writing to the gain cell by applying a logic level to the BL and connecting the BL to the storage node by providing a write trigger signal at the WWL and reading from the transistor by presetting the BL to a preset level and connecting the storage node to the BL by providing a read trigger signal at the RWL.

According to some embodiments of the present disclosure, setting the BL to the logic level and presetting the BL to the preset level are performed by a driver connected to the BL.

According to some embodiments of the present disclosure, a diffusion of at least one transistor of the write element and a diffusion of at least one transistor of the read element are connected to the BL.

According to some embodiments of the present disclosure, a gate of at least one transistor of the write element is connected to the WWL.

According to some embodiments of the present disclosure, a diffusion of at least one transistor of the read element is connected to the RWL.

According to some embodiments of the present disclosure, a gate of at least one transistor of the read element is connected to the RWL.

According to some embodiments of the present disclosure, the gain cell write element includes a write transistor and the read element includes a storage transistor and a read transistor. The write transistor has a first diffusion connected to the BL, a gate connected to the WWL and a second diffusion connected to the storage node. The storage transistor has a gate connected to the storage node, a first diffusion connected to a reference voltage, and a second diffusion. The read transistor has a gate connected to the RWL, a first diffusion connected to the second diffusion of the storage transistor, and a second diffusion connected to the BL.

According to some embodiments of the present disclosure, at least one transistor of the write element and at least one transistor of the read element are field-effect transistors (FETs).

According to some embodiments of the present disclosure, at least one transistor of the write element and at least one transistor of the read element are non-planar transistors.

According to some embodiments of the present disclosure, the BL is connected to the write element and to the read element by a single wire on an interconnect layer of the gain cell.

According to some embodiments of the present disclosure, the BL is connected to a diffusion of at least one transistor of the write element and to a diffusion of at least one transistor of the read element by a single wire on an interconnect layer of the gain cell.

According to a third aspect of some embodiments of the present disclosure there is provided a memory which includes a data write interface, a data read interface and multiple gain cells. The data write interface inputs data written to the memory. The data read interface outputs data read from the memory. The gain cells are associated with the data write interface and the data read interface, and are configured to store data input at the data write interface and to output stored data to the data read interface. At least some of the gain cells are configured to input a logic level from and to output a logic level to the same bitline (BL). The BL is shared by at least two of the gain cells.

According to some embodiments of the present disclosure, each of the gain cells is connected to a write word line (WWL) and a read word line (RWL) and is configured to store a logic level from the BL in the gain cell when a write trigger signal is applied to the WWL and to output the stored logic level to the BL when a read trigger signal is applied to the RWL.

According to some embodiments of the present disclosure, at least one transistor of the write element and at least one transistor of the read element are field-effect transistors (FETs).

According to some embodiments of the present disclosure, at least one transistor of the write element and at least one transistor of the read element are non-planar transistors.

According to some embodiments of the present disclosure, the BL is connected to a set of gain cells by a single wire on an interconnect layer of the memory.

According to some embodiments of the present disclosure, the gain cells are arranged in an array of rows and columns, and the BL is connected to a row of gain cells by a single wire on an interconnect layer of the memory.

According to some embodiments of the present disclosure, the gain cells are arranged in an array of rows and columns, and a column of gain cells share a RWL and a WWL.

Unless otherwise defined, all technical and/or scientific terms used within this document have meaning as commonly understood by one of ordinary skill in the art/s to which the present disclosure pertains. Methods and/or materials similar or equivalent to those described herein can be used in the practice and/or testing of embodiments of the present disclosure, and exemplary methods and/or materials are described below. Regarding exemplary embodiments described below, the materials, methods, and examples are illustrative and are not intended to be necessarily limiting.

Some embodiments of the present disclosure may be embodied as a semiconductor device, system or method. For example, some embodiments of the present disclosure may take the form of an entirely hardware embodiment or an embodiment combining software and hardware aspects that may all generally be referred to herein as a "circuit," "module" and/or "system."

Implementation of the method and/or system of some embodiments of the present disclosure may involve performing and/or completing selected tasks manually, automatically, or a combination thereof. According to actual instrumentation and/or equipment of some embodiments of the method and/or system of the present disclosure, several selected tasks could be implemented by hardware, by software or by firmware and/or by a combination thereof, e.g., using an operating system.

For example, hardware for performing selected tasks according to some embodiments of the present disclosure could be implemented as a chip, as part of a chip or a circuit. As software, selected tasks according to some embodiments of the present disclosure could be implemented as a plurality of software instructions being executed by a computational device e.g., using any suitable operating system.

In some embodiments, one or more tasks according to some exemplary embodiments of method and/or system as described herein are performed by a data processor, such as a computing platform for executing a plurality of instructions. Optionally, the data processor includes a volatile memory for storing instructions and/or data and/or a non-volatile storage e.g., for storing instructions and/or data. Optionally, a network connection is provided as well. User interface/s e.g., display/s and/or user input device/s are optionally provided.

Some embodiments of the present disclosure may be described below with reference to flowchart illustrations and/or block diagrams. For example illustrating exemplary semiconductor devices and/or methods and/or apparatus (systems).

The flowchart and block diagrams in the Figures illustrate the architecture, functionality, and operation of possible implementations of semiconductor devices, systems, and methods according to various embodiments of the disclosed subject matter. In this regard, each block in the flowchart or block diagrams may represent a module, segment, or portion of instructions, which comprises one or more executable instructions for implementing the specified logical function (s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions. Further, block diagrams may represent hardware components that coexist and operate in parallel, exchanging information and/or interacting through connections between them.

BRIEF DESCRIPTION OF THE DRAWINGS

In order to understand the invention, embodiments will now be described, by way of non-limiting example only, with reference to the accompanying drawings. Features shown in the drawings are meant to be illustrative of only some embodiments of the presently disclosed subject matter, unless otherwise indicated. In the drawings like reference numerals are used to indicate corresponding parts.

In block diagrams and flowcharts, optional elements/components and optional stages may be included within dashed boxes.

In the figures:

FIG. 1 is a simplified block diagram of a gain cell, according to some embodiments of the presently disclosed subject matter.

FIG. 2 is a simplified circuit diagram of a gain cell, according to an exemplary embodiment of the disclosure;

Figure 8:
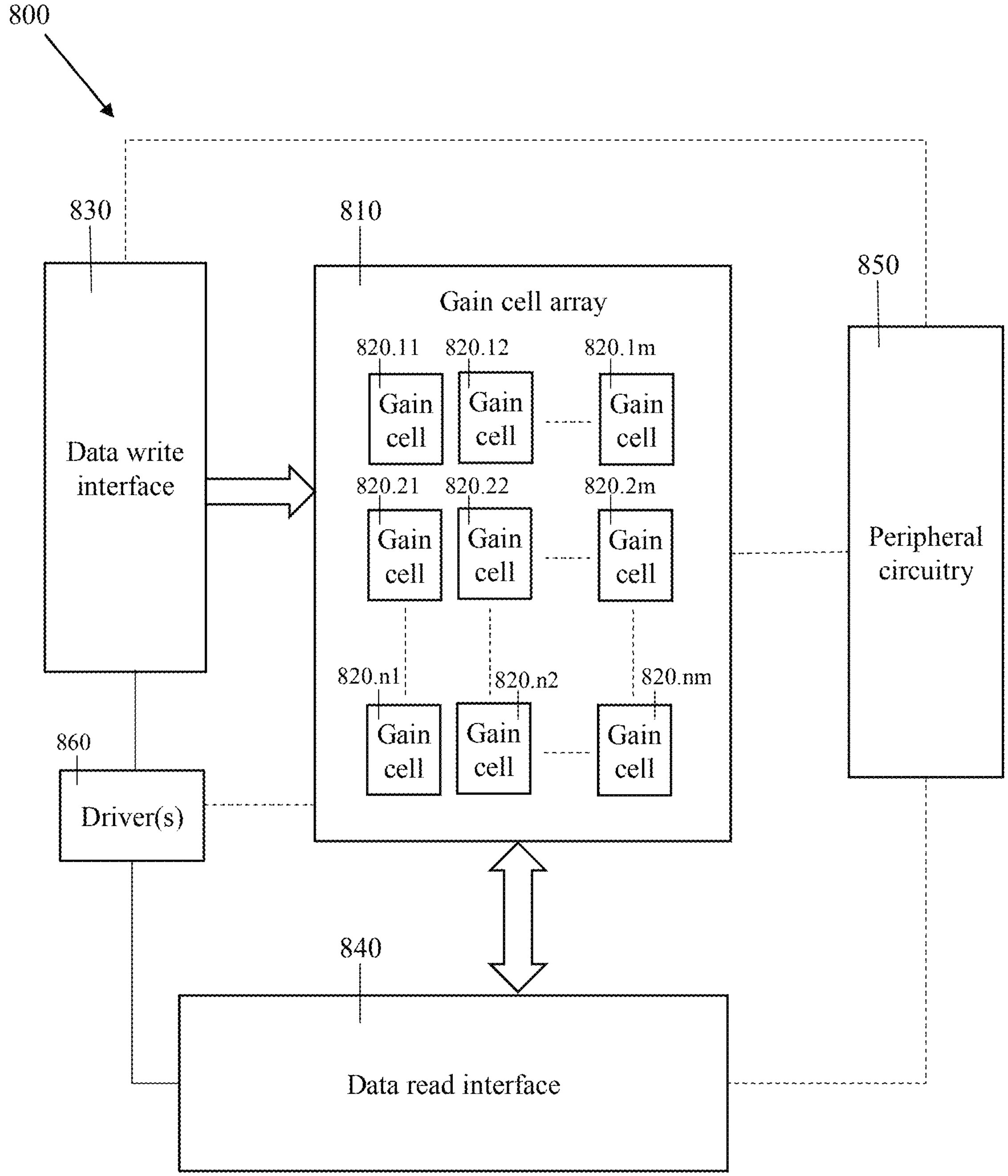
Figure 9:
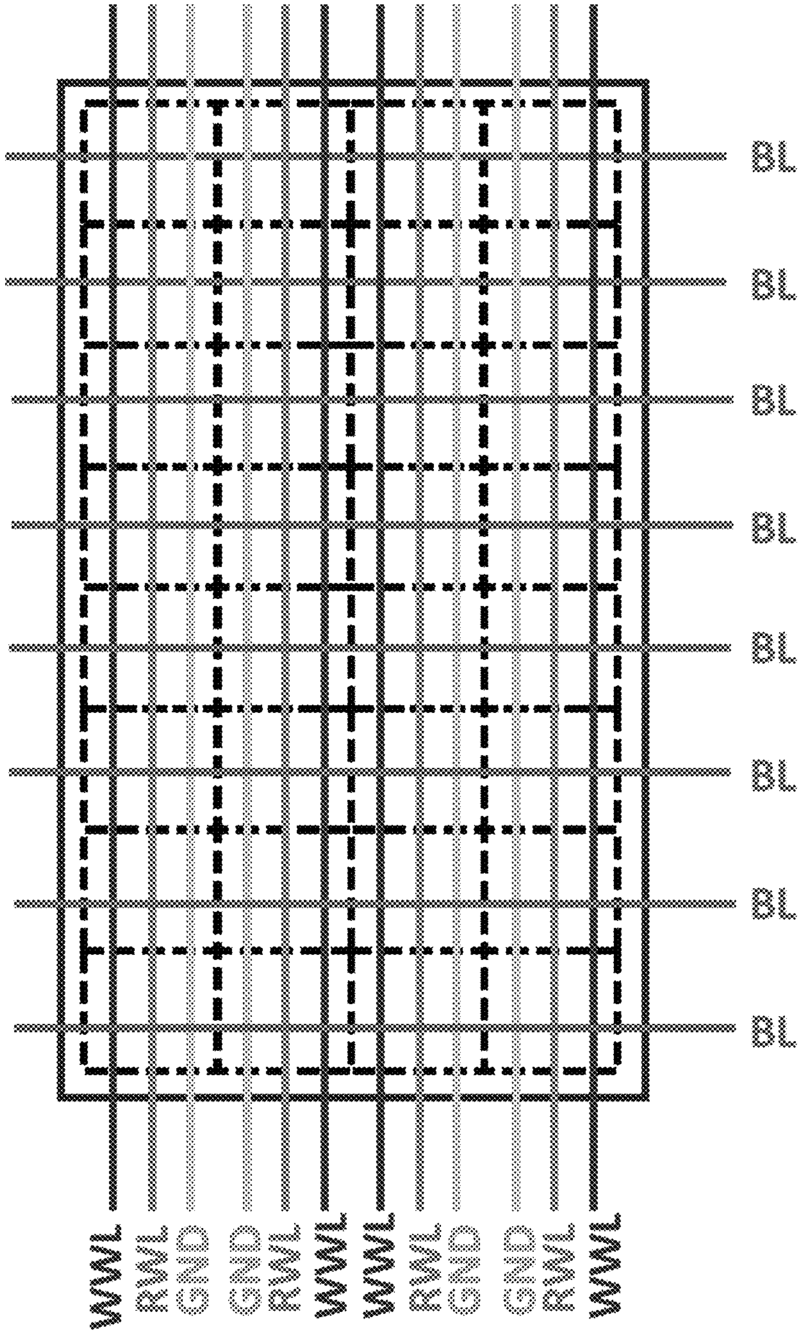
Figure 13:
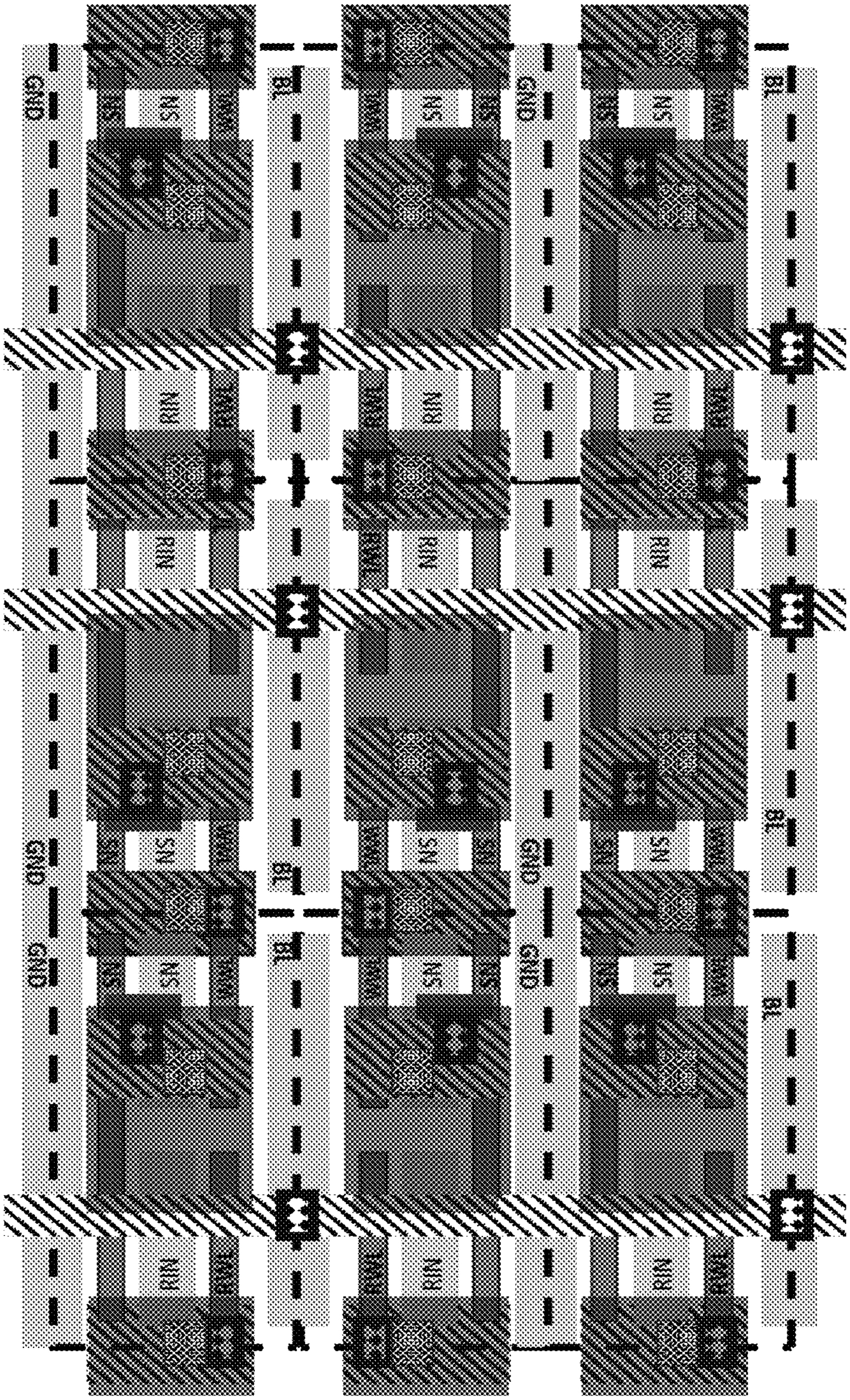
Figure 14:
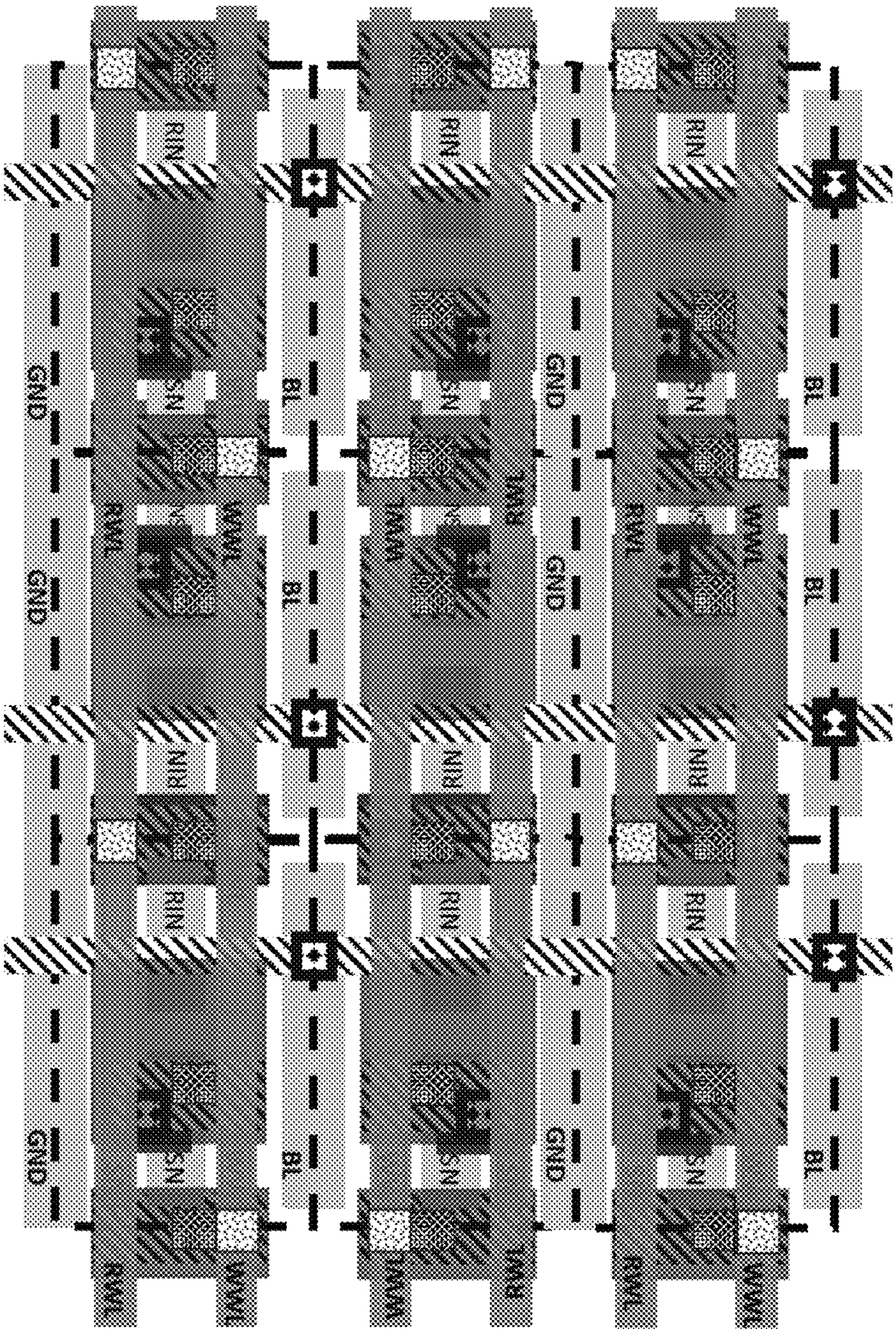
Figure 15:
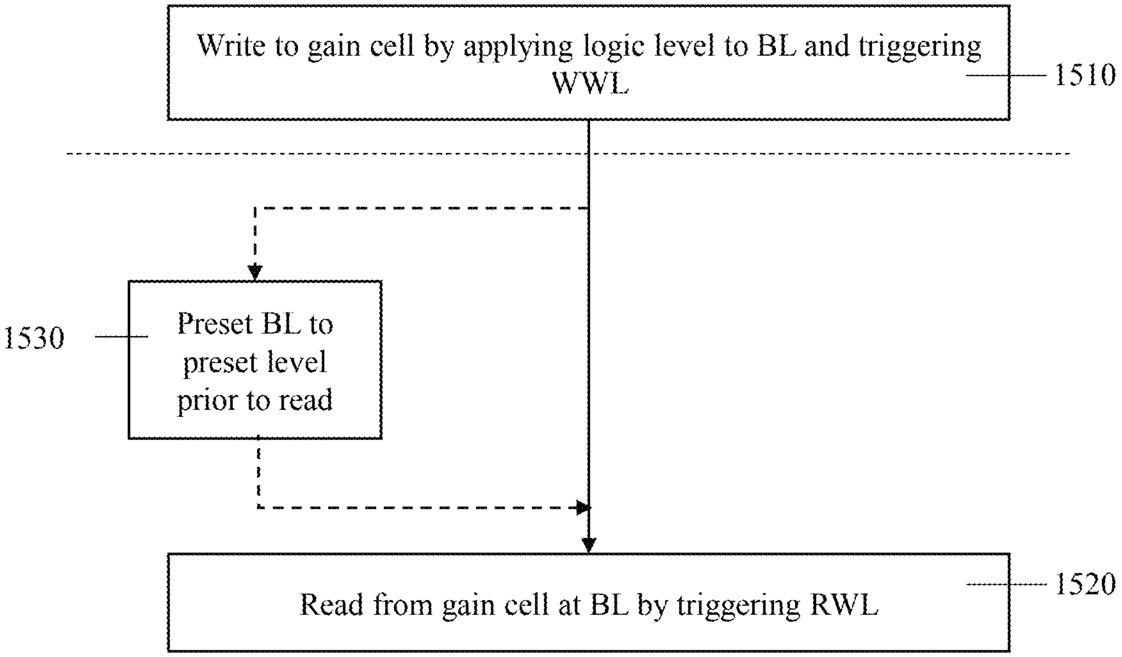

FIGS. 3-4, 5A, 5B, and 6-7 are simplified illustrations of the layers of an exemplary finFET 3T gain cell, according to some embodiments of the disclosure;

FIG. 8 is a simplified block diagram of a memory, according to some embodiments of the disclosure;

FIG. 9 is a simplified illustration of the relative directions of the WWL, RWL, GND and BL lines in an exemplary gain cell array;

FIGS. 10-14 are simplified illustrations of the respective layers of an array of finFET gain cells, according to some embodiments of the invention; and FIG. 15 is a simplified flowchart of a method of storing data in a gain cell, according to some embodiments of the disclosure.

The various embodiments of the presently disclosed subject matter are described below with reference to the drawings, which are to be considered in all aspects as illustrative only and not restrictive in any manner.

Elements illustrated in the drawings are not necessarily to scale. Moreover, two different objects in the same figure may be drawn to different scales.

DETAILED DESCRIPTION OF EMBODIMENTS

The present disclosure, in some embodiments, thereof, relates to a gain cell and, more particularly, but not exclusively, to a non-planar gain cell.

Figure 11:
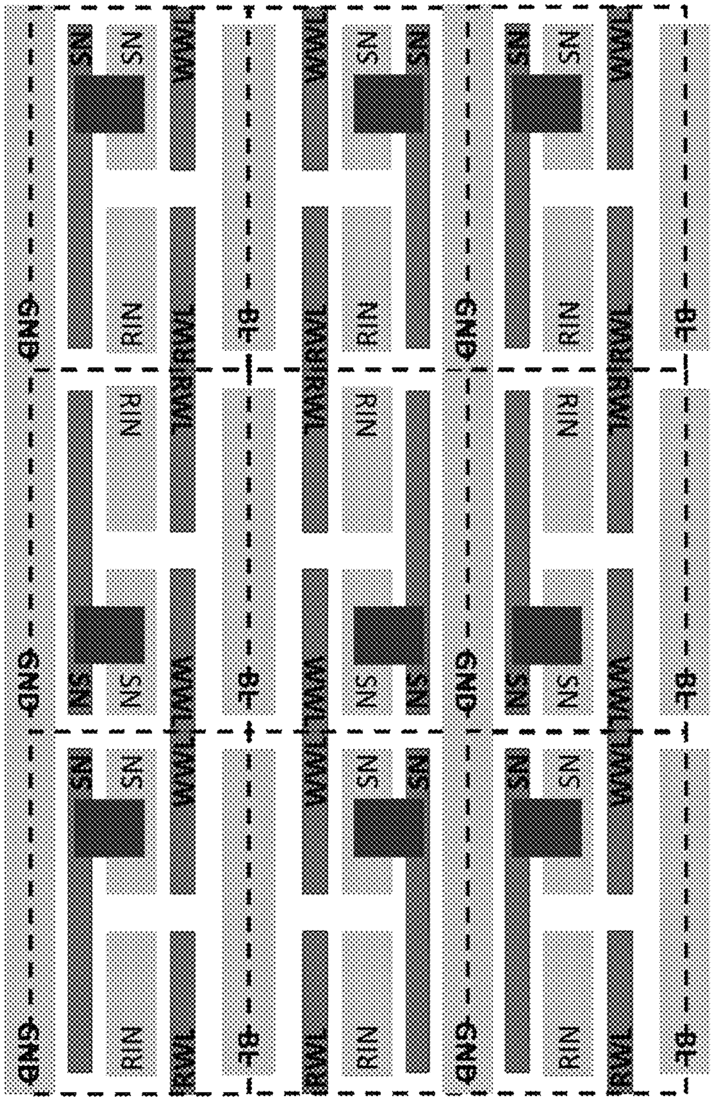

According to some embodiments of the present disclosure a gain cell uses a single bit line for both write and read operations. Using a single bit line may reduce the area requirements of the gain cell itself and of a memory which includes an array of such gain cells. Optionally, additional area efficiency is obtained by orienting gain cells in an array such that some routing tracks are shared (e.g. as shown in FIG. 11 for WWL, RWL, BL and GND).

The principles, uses and implementations of the teachings herein may be better understood with reference to the accompanying description and figures. Upon perusal of the description and figures present herein, one skilled in the art will be able to implement the teachings herein without undue effort or experimentation.

Before explaining at least one embodiment in detail, it is to be understood that embodiments are not necessarily limited in its application to the details of construction and the arrangement of the components and/or methods set forth in the following description and/or illustrated in the drawings and/or the Examples.

I. Gain Cell

Figure 1:
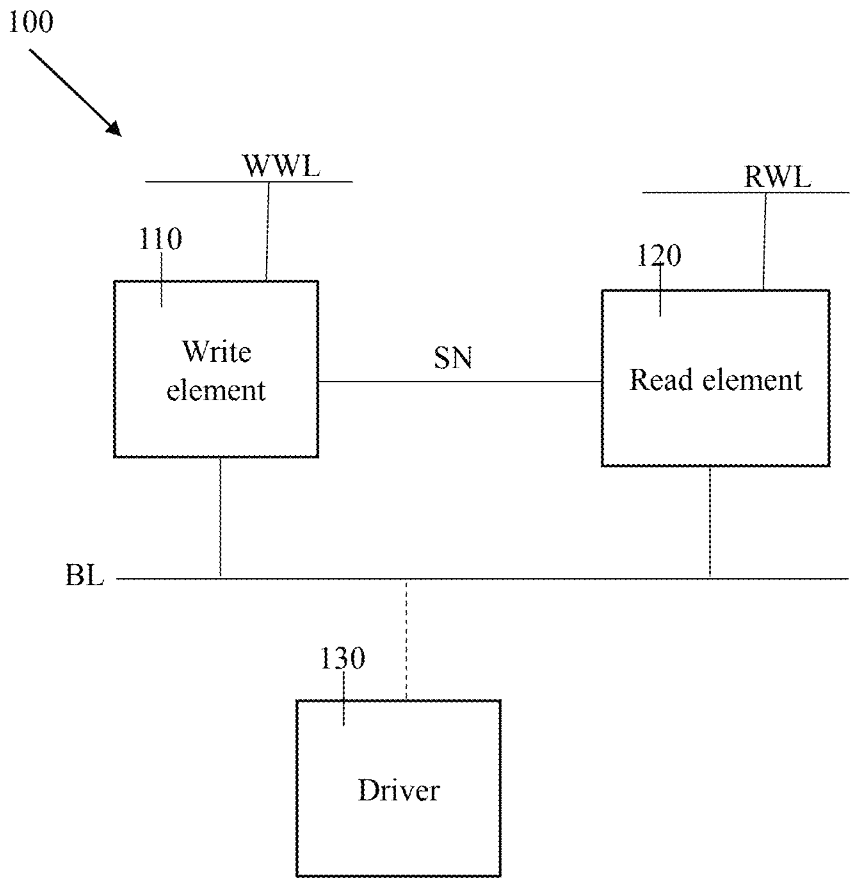

Referring now to the drawings, FIG. 1 is a simplified block diagram of a gain cell, according to some embodiments of the presently disclosed subject matter.

Gain cell 100 includes write element 110 and read element 120. Write element 110 and read element 120 share a single bitline (also referred to herein as a tied bitline or tied BL). Since a single bitline is used both for inputting the logic level to write element 110 and for outputting the logic level from read element 120, write and read operations are performed separately.

Write element 110 includes at least one transistor. Similarly, read element 120 also includes at least one transistor. The total number of transistors in gain cell 100 is determined by the gain cell structure. For example, a two-transistor (2T) gain cell includes one transistor in write element 110 and one transistor in read element 120. In the exemplary three transistor (3T) gain cell described herein, write element 110 includes one transistor and read element 120 includes two transistors.

Using a tied bitline for the write element and the read element reduces the number of signals that are routed to the gain cell and consequently the total area needed for the gain cell. Thus the same area on the chip may accommodate larger gain cell arrays than would be possible for similar gain cells with separate bitlines for write and read (e.g. WBL and RBL in eDRAM).

Write element 110 is connected a write word line (WWL). Signals on WWL trigger gain cell write operations. When a write operation is triggered at WWL, the logic level from BL is written to storage node (SN).

Read element 120 is connected to a read word line (RWL). Signals on RWL trigger gain cell read operations. When a read operation is triggered at RWL, the logic level at SN is output to BL.

Optionally, the gain cell includes one or more additional components (e.g. diodes, capacitors, etc.) to improve gain cell performance. For example, increasing the capacitance at the storage node may increase the gain cell data retention time.

Gain cells may require connection(s) to a supply voltage and/or ground and/or reference voltage(s). For clarity, these connections are not shown in FIG. 1 as they will vary depending on the layout of a specific gain cell.

As used herein, according to some embodiments of the presently disclosed subject matter, the term "reference voltage" encompasses supply voltage VDD, ground and/or any other voltage or level used as a reference for gain cell operation.

Optionally, gain cell 100 includes (or is connected to) driver 130 which is connected to BL. Driver 130 sets the BL to the input logic level prior to a write operation.

In some types of gain cells, the bitline is preset to a preset value (e.g. voltage level or ground) prior to the read operation, and optionally at times that the gain cell is not being accessed. Optionally, driver 130 presets the BL to a preset level prior to a read operation.

In some embodiments, the data output signal at BL requires further processing to determine the logic level (e.g. by using a sense amplifier). Optionally, gain cell 100 includes additional circuitry which ensures that this processing is not performed when an input data level is established at BL, only when an output data level is being read out of gain cell 100.

Optionally, the BL is connected to a diffusion of a transistor in write element 110 and to a diffusion of a transistor of read element 120.

Optionally, the WWL is connected to the gate of a transistor in write element 110.

Optionally, the RWL is connected to the gate of a transistor in read element 120. In alternate embodiments, the RWL is connected to the diffusion of a transistor in read element 120.

In some embodiments of the invention, the write element transistor(s) and the read element transistor(s) are field-effect transistors (FETs).

Examples of FET transistors include but are not limited to: metal-oxide-semiconductor FET (MOSFET), Fully Depleted Silicon On Insulator (FDSOI) FET, and Bulk Complementary metal-oxide-semiconductor (CMOS), fin FET (FinFET), Gate All Around (GAA) FET, nanowire transistors, nanosheet transistors multi-gate transistors, carbon-nanotube FET (CNTFET) and ferroelectric FET (FeFET).

As used herein, according to some embodiments of the presently disclosed subject matter, the terms "field-effect transistor" and "FET" encompass any type of known or future FET transistor and/or FET process technologies which are suitable for the implementation of a gain cell.

II. Non-Planar Gain Cells

Optionally, the gain cell is implemented in a non-planar transistor technology. A gain cell which includes non-planar transistors is denoted herein a non-planar gain cell.

Non-planar transistors are advanced semiconductor devices that depart from the traditional flat (planar) transistor using a three-dimensional structure architecture. Non-planar semiconductor devices have a vertical, multi-layered structure. For example, a FinFET transistor is made up of a fin and gate metal which are both on top of the substrate, yielding a three-dimensional structure.

The way in which the tied BL is routed in the non-planar structure may differ for different transistor technologies. The complexities of manufacturing the non-planar transistor structure may create limitations on how gates, channels, diffusions, contacts/vias, metal interconnects etc. may be created and oriented.

As used herein, according to some embodiments of the presently disclosed subject matter, the term "non-planar transistor" include any type of known or future non-planar transistors and/or non-planar process technologies which are suitable for the implementation of a gain cell.

Figure 5A:
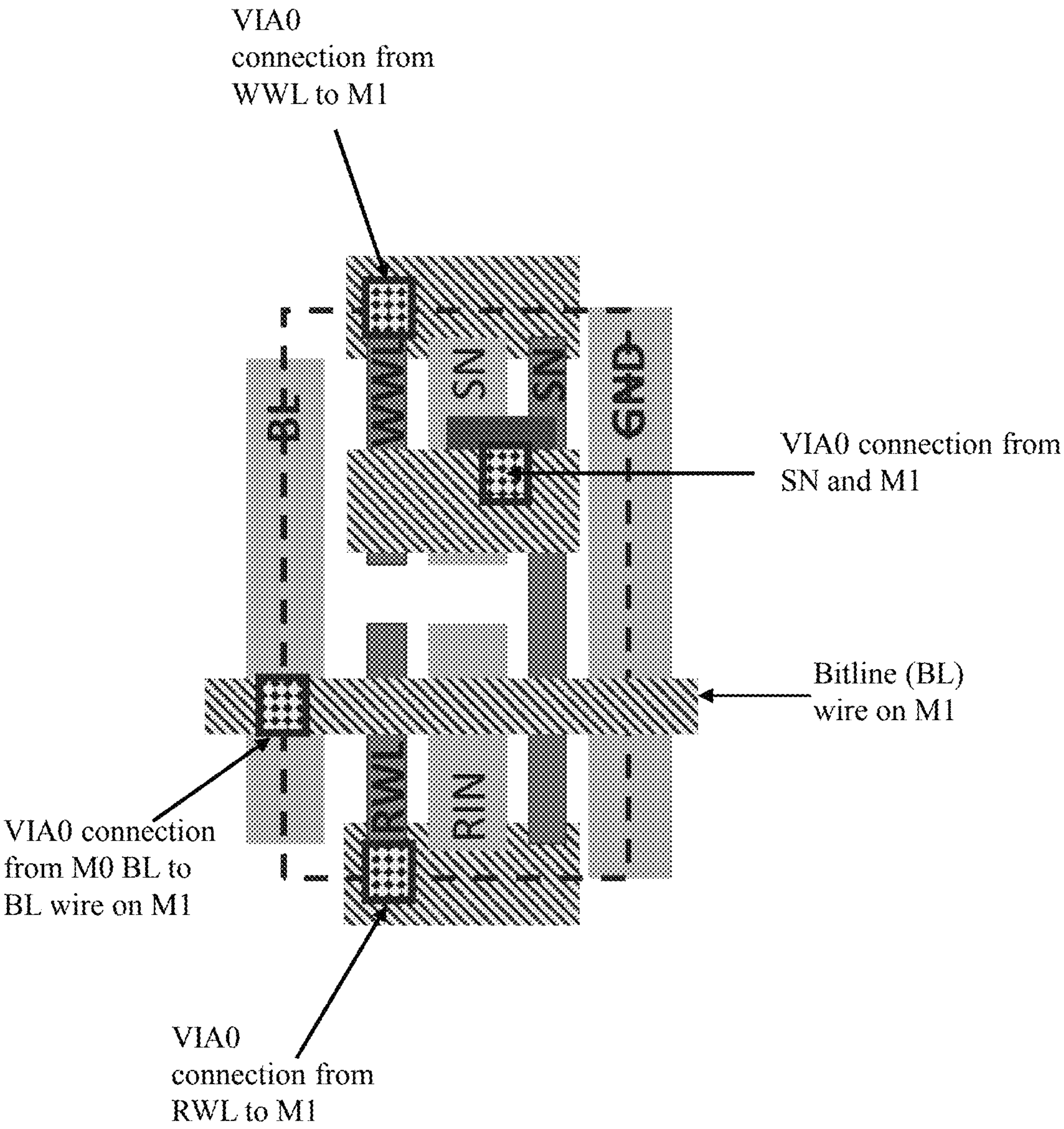

Optionally, for a non-planar gain cell, the tied BL is connected to the write element and to the read element by a single wire on a single layer of the gain cell (for example as illustrated in FIG. 5A where the BL is formed on the M0 layer and connected with a BL wire on M1). Further optionally, the tied BL is connected to a diffusion of at least one transistor of the write element and to a diffusion of at least one transistor of the read element by a single wire on an interconnect layer of the gain cell.

Non-limiting examples of non-planar transistors include: fin FET (finFET), and Gate All Around (GAA) transistors, nanowire transistors, nanosheet transistors, multi-gate transistors, Forksheet transistors and Complementary FETs.

Optionally, when multiple non-planar transistor gain cells are arranged as an array, the tied BLs of some or all of the transistors in the array are connected by a single wire on an interconnect layer of the array. In some embodiments of the disclosure, the BLs of each set of gain cells in an array (e.g. the gain cells in each row) are connected by a respective single wire.

The data retention time is typically proportional to capacitance connected to the storage node.

Optionally, the capacitance of the SN is increased by an additional single layer or stacked layers that are connected to SN. For example, the additional layers may be conductor/insulator/conductor layers stacked above the gain cell and connected to the SN.

Alternately or additionally, capacitive layers may be added in between one or more pairs of metal layers (e.g. between M1-M2, M2-M3, etc.).

By connecting the SN level to higher metal layers, the coupling capacitive effects on the metal layers increases. Thus, the total effective capacitance on the SN node increases.

Examples of a non-planar gain cell and of an array of non-planar gain cells are presented below.

III. Exemplary Gain Cell

Figure 2:
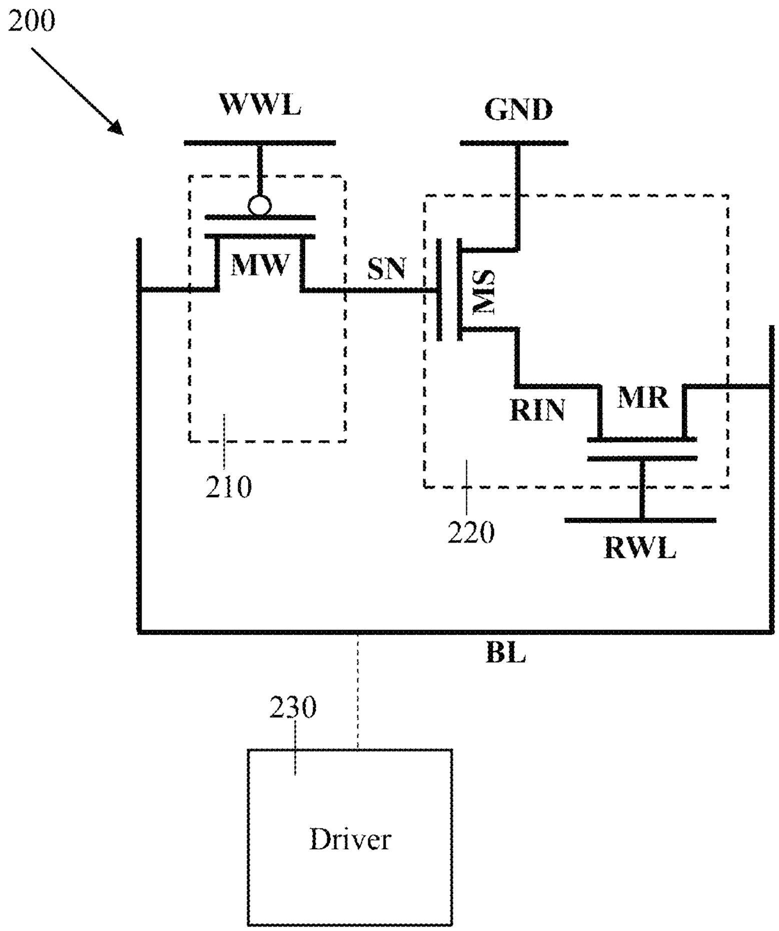

Reference is now made to FIG. 2, which is a simplified circuit diagram of a gain cell, according to an exemplary embodiment of the disclosure. Gain cell 200 is a 3T gain cell.

Write element 210 includes a single transistor, write transistor MW. Write transistor MW has one diffusion connected to the BL, a gate connected to the WWL and a second diffusion.

Read element 220 includes two transistors, storage transistor MS and read transistor MR. Storage transistor MS has a gate connected to the second diffusion of MW (forming storage node SN), a first diffusion connected to a reference voltage, and a second diffusion. Read transistor MR has a gate connected to the RWL, a first diffusion connected to the second diffusion of MS (forming the read intermediate node RIN), and a second diffusion connected to the BL.

In the exemplary embodiment of FIG. 2, MW is a PMOS transistor, MS and MR are NMOS transistors, and the reference level is ground (GND). As will be appreciated by a person of skill in the art, other embodiments may have a similar circuit layout with different types of transistors, which may require adjustment to the reference level(s) and/or threshold value(s) and/or other signals applied to BL, WWL and RWL, while maintaining a tied-BL structure. Alternately or additionally, in a finFET gain cell the transistors may have a variable number of fins (e.g. width/length).

Optionally, gain cell 200 is associated with driver 230 which provides an input data level to BL prior to a write operation, and presets the level at BL prior to a read operation if needed for gain cell operation.

III.1. Exemplary Non-Planar Gain Cell

Reference is now made to FIGS. 3-7, which are simplified illustrations of the layers of an exemplary finFET 3T gain cell, according to some embodiments of the disclosure. The gain cell includes two NMOS and one PMOS transistor, which are connected as shown in FIG. 2. It includes has four internal connections and two internal nodes.

The read port and the write port connect to a tied bit line (BL). This layout may reduce gain cell area relative to gain cells which use separate bitlines for write and read.

In the exemplary gain cell illustrated in FIGS. 3-7, the storage node (SN) is connected to upper metal layers, which may increase capacitance and enhance data retention time (DRT). However other embodiments of a tied-BL gain cell may not include such a connection.

FIGS. 3-7 show the succession of layers from the bottom substrate layer (poly) up to the upper layers M3 and VIA2.

Figure 3:
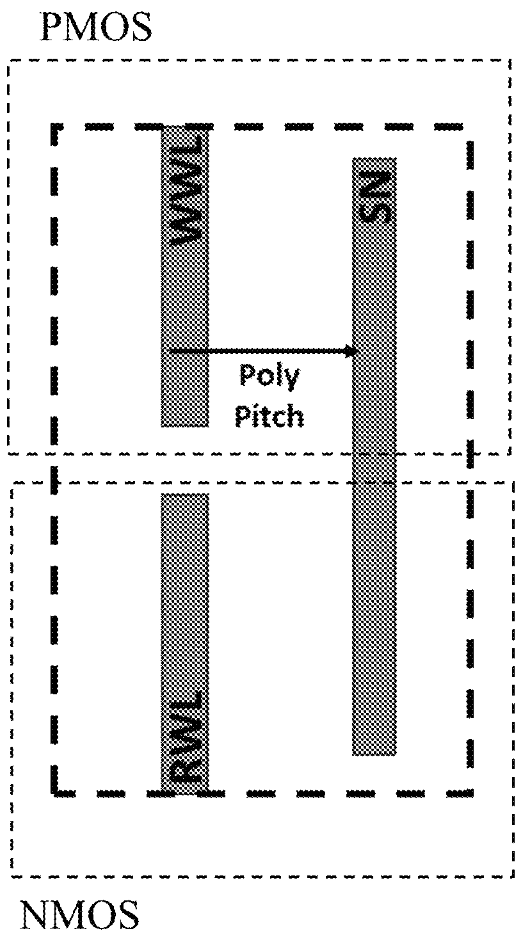

FIG. 3 shows the poly layer. The poly layer is used for routing the gates of the MOS transistors (WWL and RWL lines) and SN. For the layout of FIG. 2, the width of the single gain-cell is set by two poly pitches due to the number and connections between the transistors.

Figure 10:
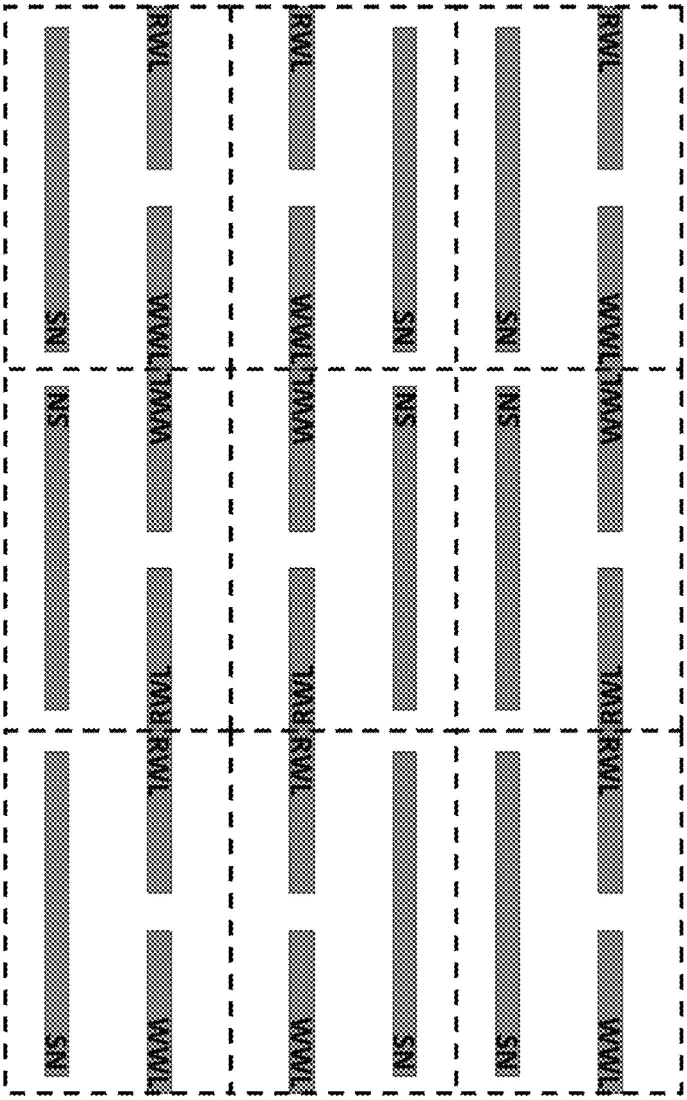

When the finFET gain cells are arranged in an array, the word lines (WWL and RWL) may be shared between two neighboring cells by mirroring on the x-axis and/or y-axis (as shown for example in FIG. 10). The NMOS transistors may be aligned in one section (e.g. the bottom section of the FIG. 3 gain cell), and the PMOS transistors may be aligned in a different section (e.g. the top section of the FIG. 3 gain cell). The SN connection is unique for every cell; however, its area may be maximized to increase its capacitance.

Figure 4:
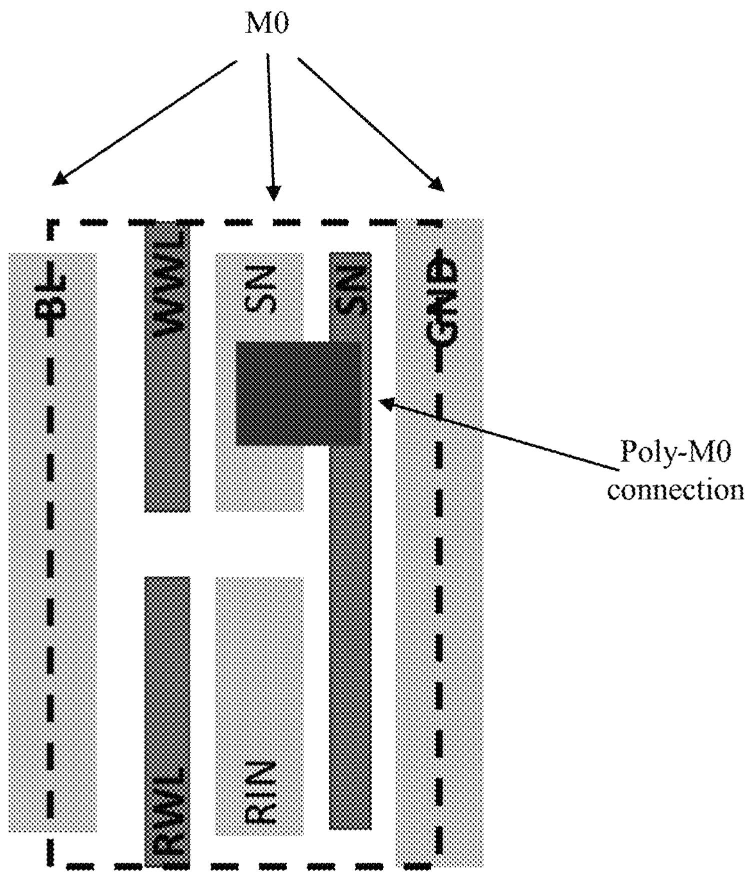

FIG. 4 shows the poly layer and M0. The M0 (metal layer 0) number and pitch are generally set by the poly pitch, which is typically fixed for advanced technologies. The POLY-M0 connection is used for the SN connection between the gate and M0 as an interconnect.

The BL and GND nodes are located on the sides, so that when the finFET gain cells are arranged in an array they may be shared with adjacent cells in the column in order to minimize the area. Additionally, GND may be connected vertically in the array and shared as well to improve the ground connection.

It is noted that the terms row and column are intended only to clarify the relative directions of the gain cells and are not limiting to a particular orientation of the gain cell array itself.

For clarity, connections between rows are denoted vertical connections and connections between columns are denoted horizontal connections (as shown for example in FIG. 9).

FIG. 5A shows the M1 (metal layer 1) and the via connections (VIA0) between the M1 layer and lower layers. There are conductive paths for BL, SN, WWL and RWL on the M1 layer.

The height of the gain cell is determined by the M1 layer. The height is eight times the minimum width of M1 (which is equivalent to four times the width of the minimum M1 pitches). This height may be decreased to six times the minimum width of M1, if there are no violations of minimum spacing rules.

When the finFET gain cells are arranged in an array, the M1 layers for WWL and RWL and their VIA0 layers may be shared with gain cells in the adjacent row, and the BL wire may be shared across the column.

Figure 5B:
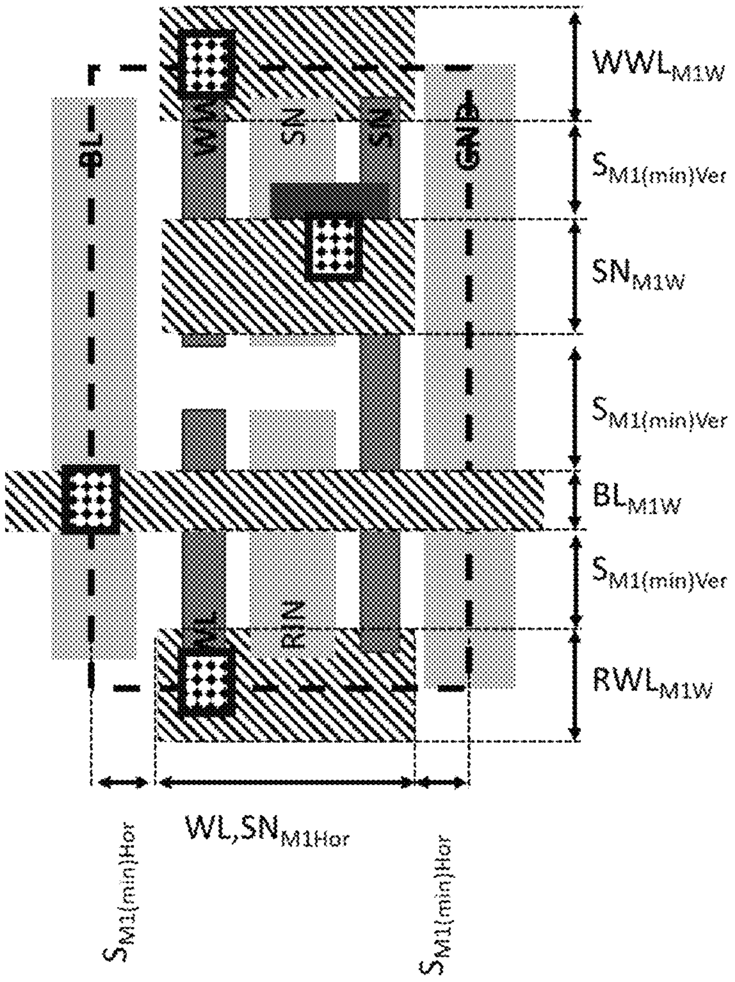

FIG. 5B is a replica of FIG. 5A which shows spacings within the M1 layer. Some spacings are based on a gain cell that is part of an array with some shared areas (e.g. WWL, RWL, etc.).

$S_{M1(min)Ver}$: The minimum required space in the vertical direction for M1.

$S_{M1(min)Hor}$: Half of the minimum required space in horizontal direction for M1 (the other half is shared with a neighbouring cell).

$WWL_{M1W}$: WWL M1 width—Used for via connections to upper metals. The width is chosen as two times the minimum size to avoid minimum area problems.

$RWL_{M1W}$: RWL M1 width—Used for via connections to upper metals. The width is chosen as two times the minimum size to avoid minimum area problems.

$SN_{M1W}$: SN M1 width—Used for via connections to upper metals. The width is chosen as two times the minimum size to avoid minimum area problems.

$BL_{M1W}$: BL M1 width—Used for connection of the bit lines in horizontal direction.

$WL,SN_{M1Hor}$: Horizontal length of the WWL, RWL and SN metals. This size is determined by the minimum spacing and minimum area constraints.

Figure 6:
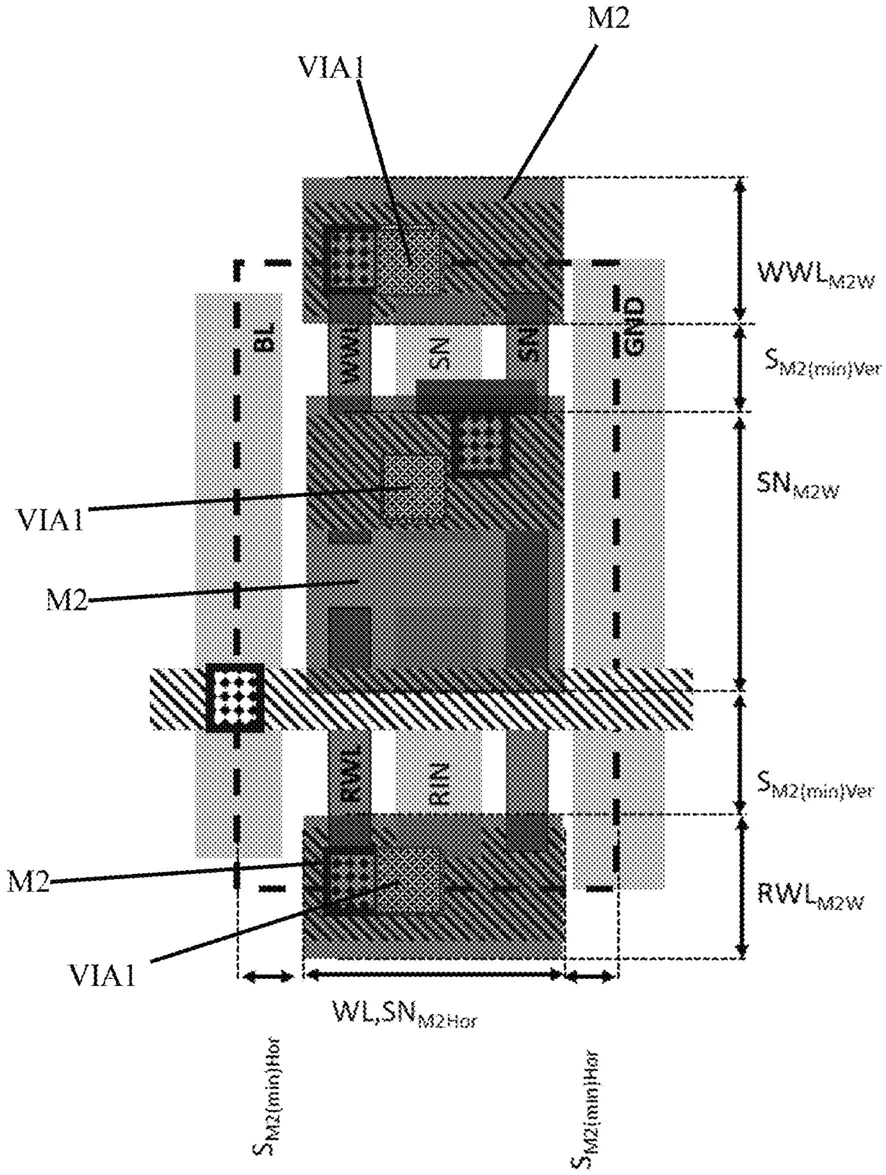

FIG. 6 shows the M2 (metal layer 2) and via connections (VIA1). The M2 structure of the gain cell follows the M1 structure with VIA1 connections. The minimum areas are used for the WWL and RWL connections. The extra area due to the lack of a second bitline wire may be used on top of the storage node to further increase the capacitance and DRT.

The distances in FIG. 6 are:

$S_{M2(min)Ver}$: The minimum required space in the vertical direction for M2.

$S_{M2(min)Hor}$: Half of the minimum required space in the horizontal direction for M2 (the other half is shared with a neighbouring cell).

$WWL_{M2W}$: WWL M2 width—Used for via connections to upper metals. The width is chosen as two times the minimum size to avoid minimum area problems.

$RWL_{M2W}$: RWL M2 width—used for via connections to upper metals. The width is chosen as two times the minimum size to avoid minimum area problems.

$SN_{M2W}$: SN M2 width—used for increasing the capacitance of SN.

$WL,SN_{M2Hor}$: Horizontal length of the WWL RWL and SN metals. This size is determined by the minimum spacing and minimum area constraints.

Figure 7:
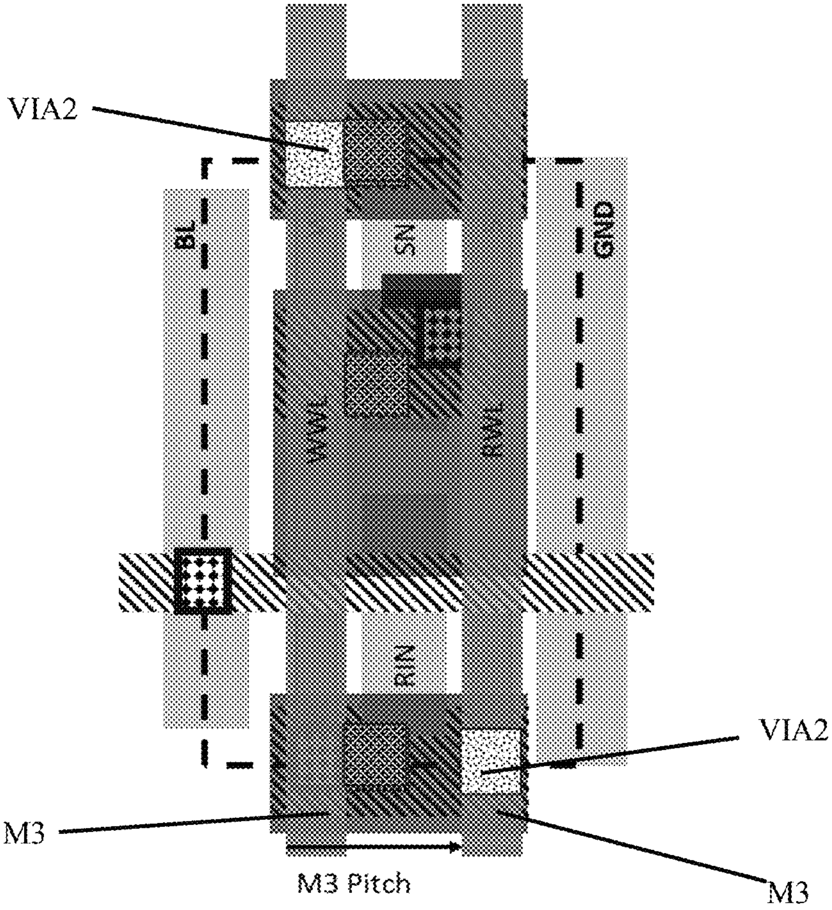

FIG. 7 shows M3 (metal layer 3). M3 is connected vertically, following the pitch of the Poly, which, with minimum spacing, may obtain the lowest resistance on the word line. The maximum number of gain cells that may connect to a single word line is related to its resistance value, so that obtaining a lower resistance enables stacking more bit-cells on a column. They are shared across all columns, and drivers are connected to these lines. By using only metals up to M3, power may be routed over the bit-cell with M4 (metal layer 4, not shown), making the array metal usage smaller relative to SRAM cells.

IV. Memory

Reference is now made to FIG. 8, which is a simplified block diagram of a memory, according to some embodiments of the disclosure. For clarity, the inner connections to each gain cell in the array (e.g. BL, WWL, RWL, VDD, GND, etc.) are not explicitly shown, but their layout and connections will be apparent to the skilled individual.

Memory 800 includes gain cell array 810, data write interface 830 and data read interface 840.

Gain cell array 810 includes multiple gain cells 820.11-820.*nm*. The gain cells are configured to store data input at data write interface 830 and to output stored data to data read interface 840. At least some of the gain cells have a shared tied bitline, from which they input a logic level to be stored and to which they output the stored logic level.

Optionally, each gain cell includes a write element and a read element, connected to form a storage node. The write element includes at least one transistor, and the read element includes at least one transistor.

Optionally, at least some of the gain cells are 3T gain cells. Further optionally, write element includes a single transistor and the read element includes two transistors (for example in accordance with any of the embodiments of the gain cell of FIG. 2).

Data write interface 830 provides data to be written to the memory 800.

Data read interface 840 outputs data read from the memory.

Although illustrated in FIG. 8 as separate components, data write interface and data read interface may be implemented as separate circuitry, the same circuitry or may share circuitry.

Optionally, memory 800 includes driver(s) 860 which is connected to the gain cell BLs. Driver(s) 860 sets the BLs to their respective input logic levels prior to a write operation. Optionally, driver(s) 860 presets the BLs to respective preset levels prior to a read operation, if required for the gain cell read.

Data write interface 830 and data read interface 840 control driver(s) 860.

Optionally, memory 800 includes timing circuitry (not shown) which ensures that the driver signal to BL is suitable for the type of operation being performed (e.g. that the BL is not preset for a read operation while a write operation is being performed). The timing circuitry may be inside write interface 830 and/or read interface 840 and/or peripheral circuitry 850.

For clarity driver(s) 860 is illustrated as a single unit that connects to all BLs. However multiple drivers may be used, each connecting to one or more BLs.

Optionally, memory 800 includes peripheral circuitry 850, as needed for functioning of memory 800. Examples of peripheral circuitry for memories includes, but is not limited to, decoders, sense amplifiers, drivers, buffers, error correction circuitry, timing control circuitry, latches, etc.

Optionally, each of the gain cells is connected to a WWL and to an RWL. Each gain cell is configured to store a logic level from the BL in the gain cell when a write trigger signal is applied to the WWL and to output the stored logic level to the BL when a read trigger signal is applied to the RWL. The WWL and/or RWL may be shared by multiple transistors. An exemplary transistor array with shared WWL, RWL and BL is described below.

In some embodiments of the disclosure, the write element transistor(s) and read element transistor(s) are planar transistors. In some alternate embodiments of the disclosure, the write element transistor(s) and read element transistor(s) are non-planar. Examples of planar and non-planar transistor technologies are listed above.

Optionally, a GND substrate connection is connected along each column and shared across the whole array.

Reference is now made to FIG. 9, which is a simplified illustration of the relative directions of the WWL, RWL, GND and BL lines in an exemplary four by eight gain cell array. There are three vertical routing tracks for WWL, RWL and GND (which may be considered as 2.5 vertical routing tracks because the ground routing track is shared). There is a single horizontal routing track for BL.

Because there is only one horizontal routing track for BL the area of the gain cell may be smaller, relative to a similar gain cell with separate horizontal routing tracks for RBL and WBL.

IV.1. Non-Planar Gain Cell Array

In some embodiments, the memory array is an array of non-planar gain cells.

In an exemplary embodiment:

i) The RWLs are connected vertically;

ii) The WWLs are connected vertically;

iii) GND is a substrate connection routed over the lowest interconnect layer that is connected vertically and shared across the entire array; and iv) BLs are connected horizontally.

Optionally, the SN (Storage Node) is connected to higher levels (e.g. above M0). This may increase the coupling effect on the SN wires, significantly enhancing single-cell retention performance.

Connecting the SN to higher levels may enable connecting additional elements to the SN. Optionally, the SN capacitance is increased by connecting it to elements such as a capacitor and/or inductor and/or resistor, which increases the data retention time even further.

Optionally, SN is used for observation purposes on test chips.

In some embodiments of the invention, the GND connection is routed over the lowest interconnect layer (such M0 metal layer which is the lowest interconnect layer in FINFET technology). The GND connection on the lowest metal layer eliminates the need for any via or upper metal wire. This may improve design efficiency and peripheral area optimization. The ground (GND) line may be routed in either direction.

Reference is now made to FIGS. 10-14, which are simplified illustrations of the respective layers of an array of finFET gain cells, according to some embodiments of the invention. FIGS. 10-14 correspond respectively to FIGS. 3, 4, 5A, 6 and 7 of the layers of a single gain cell, and illustrate how the gain cells are oriented relative to adjacent gain cells in order to minimize area requirements.

Reference is now made to FIG. 10, which is a simplified illustration of the poly layer of a three by three gain cell array. The gain cells are oriented so that WWL is shared by two gain cells in the vertical direction. RWL is also shared by two gain cells in the vertical direction.

Reference is now made to FIG. 11, which is a simplified illustration of the poly and M0 layers of the gain cell array. GND lines run vertically. Each GND line is shared horizontally by two gain cells. In the vertical direction, GND is shared by all gain cells.

Figure 12:
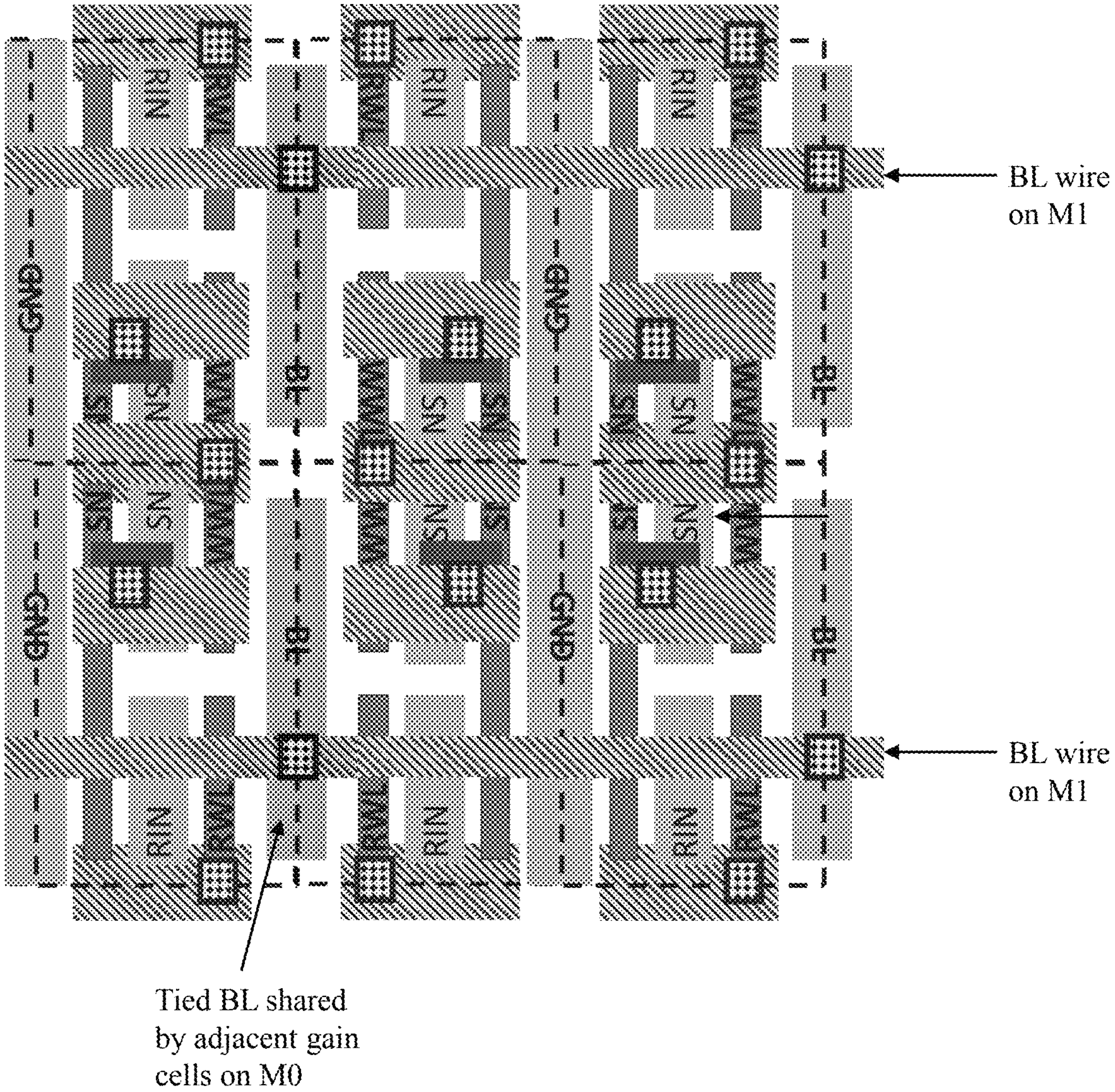

Reference is now made to FIG. 12, which is a simplified illustration showing the M1 layer and VIA0 of the gain cell array, above the poly and M0. FIG. 12 shows two rows of the gain cell array. In each row the gain cells share a tied BL, running horizontally.

In FIG. 12, the BL is shared between two rows. The BL is mirrored, so that it is the same M0 in row 1 and row 2 and then again on row 3 and 4, etc. The BL signal is shared by an entire column, but two gain cells on two adjacent rows share the connection from the BL to the M0 layer that is in between them.

Reference is now made to FIG. 13, which is a simplified illustration showing the M2 and VIA1 of the gain cell array, above M1 and VIA0.

Reference is now made to FIG. 14, which is a simplified illustration showing the M3 layer of the gain cell array, above M2 and VIA1.

V. Method of Storing Data in a Gain Cell

Reference is now made to FIG. 15, which is a simplified flowchart of a method of storing data in a gain cell, according to some embodiments of the disclosure.

The gain cell includes a write element and a read element, connected to form a storage node. The write element includes at least one transistor, and the read element includes at least one transistor. The gain cell has a tied bitline for inputting a logic level into the write element and reading the stored logic level from the read element.

Optionally, at least some of the gain cells are 3T gain cells. Further optionally, write element includes a single transistor and the read element includes two transistors (for example in accordance with any of the embodiments of the gain cell of FIG. 2).

In 1510 a logic level is written to the gain cell by applying a data signal to BL and providing a write trigger signal to the WWL. The write trigger signal connects BL to SN through the write element. Optionally, the logic level is applied to BL by a driver connected to BL.

In 1520 the logic level is read from the gain cell at BL by providing a read trigger signal to RWL. The read trigger signal connects BL to SN through the read element.

Optionally, in 1530 the method includes the further step of presetting BL to a preset level prior to the read operation. Optionally, BL is preset to the preset level by a driver. Further optionally, the preset operation is skipped before a read operation if the BL is already at an acceptable preset level for the read operation.

Optionally, a diffusion of at least one transistor of the write element and a diffusion of at least one transistor of the read element are connected to the BL.

Optionally, a gate of at least one transistor of the write element is connected to the WWL.

Optionally, a gate of at least one transistor of the read element is connected to the RWL. In alternate optional embodiments, a diffusion of at least one transistor of the read element is connected to the RWL.

Optionally, the gain cell has the structure shown in FIG. 2.

Optionally, at least one transistor of the write element and at least one transistor of the read element are non-planar. Further optionally, at least one transistor of the write element and at least one transistor of the read element are field-effect transistors (FETs).

Optionally, the BL is connected to the write element and to the read element by a single wire on an interconnect layer of the gain cell. Further optionally, the BL is connected to a diffusion of at least one transistor of the write element and to a diffusion of at least one transistor of the read element by a single wire on an interconnect layer of the gain cell.

It is expected that during the life of a patent maturing from this application many relevant gain cells, planar transistors, non-planar transistors and memory arrays will be developed and the scope of the terms gain cells, planar transistors, non-planar transistors and memory arrays is intended to include all such new technologies a priori.

General

The terms "comprises", "comprising", "includes", "including", "having" and their conjugates mean "including but not limited to".

The term "consisting of" means "including and limited to".

As used herein, singular forms, for example, "a", "an" and "the" include plural references unless the context clearly dictates otherwise.

Within this application, various quantifications and/or expressions may include use of ranges. Range format should not be construed as an inflexible limitation on the scope of the present disclosure. Accordingly, descriptions including ranges should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within the stated range and/or subrange, for example, 1, 2, 3, 4, 5, and 6. Whenever a numerical range is indicated within this document, it is meant to include any cited numeral (fractional or integral) within the indicated range.

It is appreciated that certain features which are (e.g., for clarity) described in the context of separate embodiments, may also be provided in combination in a single embodiment. Where various features of the present disclosure, which are (e.g., for brevity) described in a context of a single embodiment, may also be provided separately or in any suitable sub-combination or may be suitable for use with any other described embodiment. Features described in the context of various embodiments are not to be considered essential features of those embodiments, unless the embodiment is inoperative without those elements.

Although the present disclosure has been described in conjunction with specific embodiments thereof, it is evident that many alternatives, modifications, and variations will be apparent to those skilled in the art. Accordingly, this application intends to embrace all such alternatives, modifications and variations that fall within the spirit and broad scope of the appended claims.

All references (e.g., publications, patents, patent applications) mentioned in this specification are herein incorporated in their entirety by reference into the specification, e.g., as if each individual publication, patent, or patent application was individually indicated to be incorporated herein by reference. Citation or identification of any reference in this application should not be construed as an admission that such reference is available as prior art to the present disclosure. In addition, any priority document(s) and/or document(s) related to this application (e.g., co-filed) are hereby incorporated herein by reference in its/their entirety.

Where section headings are used in this document, they should not be interpreted as necessarily limiting.

The invention claimed is:

1. A gain cell for storing a data level, comprising:

a write element connected to a write word line (WWL) and a bit line (BL), configured to write a logic level from said BL to a storage node of said gain cell when a write operation is triggered on said WWL, said write element comprising at least one transistor; and a read element connected to a read word line (RWL) and said bit line (BL), configured to read a logic level from said storage node to said BL when a read operation is triggered on said RWL, said read element comprising at least one transistor; and a bit line connector comprising a single wire on an interconnect layer of said gain cell connecting said write element and said read element;

wherein said BL is formed in a different layer of said gain cell to said interconnect layer and is connected to said single wire through a via connection.

2. The gain cell of claim 1, wherein a driver is connected to said BL, said driver being configured for setting said BL to said logic level prior to a write operation and for presetting a level of said BL to a preset level prior to a read operation.

3. The gain cell of claim 1, wherein said BL is connected, by said single wire, to a diffusion of at least one transistor of said write element and to a diffusion of at least one transistor of said read element.

4. The gain cell of claim 1, wherein said WWL is connected to a gate of at least one transistor of said write element.

5. The gain cell of claim 1, wherein said RWL is connected to a gate of at least one transistor of said read element.

6. The gain cell of claim 1, wherein said RWL is connected to a diffusion of at least one transistor of said read element.

7. The gain cell of claim 1, wherein:

said write element comprises a write transistor, comprising a first diffusion connected to said BL by said single wire, a gate connected to said WWL and a second diffusion connected to said storage node; and said read element comprises:

a storage transistor comprising a gate connected to said storage node, a first diffusion connected to a reference voltage, and a second diffusion; and a read transistor associated with said storage transistor, comprising a gate connected to said RWL, a first diffusion connected to said second diffusion of said storage transistor, and a second diffusion connected to said BL.

8. The gain cell of claim 1, wherein said at least one transistor of said write element and said at least one transistor of said read element are field-effect transistors (FETs).

9. The gain cell of claim 1, wherein said at least one transistor of said write element and said at least one transistor of said read element are non-planar transistors.

10. The gain cell of claim 1, further comprising at least one layer of material connected to said storage node, wherein said at least one layer increases the capacitance of said storage node.

11. A method of storing data in a gain cell: the gain cell comprising:

a write element comprising at least one transistor, said write element being connected to a bit line (BL) and a write word line (WWL);

a read element comprising at least one transistor, said read element being connected to said bit line (BL) and a read word line (RWL), said write element and said read element being connected to create a storage node; and a bit line connector comprising a single wire on an interconnect layer of said gain cell connecting said write element and said read element;

wherein said BL is formed in a layer of said gain cell above said interconnect layer and is connected to said single wire through a via connection;

wherein the method comprises:

writing to said gain cell by applying a logic level to said BL and connecting said BL to said storage node by providing a write trigger signal at said WWL; and reading from said gain cell by presetting said BL to a preset level and connecting said storage node to said BL by providing a read trigger signal at said RWL.

12. The method of claim 11, wherein said setting said BL to said logic level and said presetting said BL to said preset level are performed by a driver connected to said BL.

13. A memory comprising:

a data write interface configured to input data written to said memory;

a data read interface configured to output data read from said memory; and a plurality of gain cells associated with said data write interface and said data read interface, configured to store data input at said data write interface and to output stored data to said data read interface, wherein at least some of said gain cells each:

comprise a write element and a read element connected by a bit line connector comprising a single wire on an interconnect layer;

are configured to input a logic level from and to output a logic level to a same bit line (BL) formed in a different layer to said interconnect layer and connected to said single wire through a via connection, wherein said BL is shared by at least two of said gain cells.

14. The memory of claim 13, wherein said plurality of gain cells are arranged in an array of rows and columns, and a column of gain cells share a RWL and a WWL.

15. The gain cell of claim 1, wherein said different layer in which said BL is formed is a layer above said interconnect layer.

16. The gain cell of claim 15, wherein said BL and said single wire are connected by a single via connection.

17. The gain cell of claim 1, wherein said gain cell is located in a row and a column of a memory comprising a plurality of gain cells arranged in an array of rows and columns, each gain cell of the plurality of gain cells occupying a footprint area of a substrate;

wherein said single wire of said bit line connector is a shared bit line connector extending from a footprint area of said gain cell into a footprint area of an adjacent gain cell in a same row of said array said shared bit line connector providing a bit line connector for said adjacent gain cell, said BL connected to both said gain cell and said adjacent gain cell in said same row by said via connection and said shared bit line connector.

18. The gain cell of claim 17, wherein a gate element of said read transistor is a shared read gate connection element extending from said footprint area of said gain cell into a footprint area of a first adjacent gain cell in a same column as said gain cell to form a gate element of a read transistor of said first adjacent gain cell.

19. The gain cell of claim 18, comprising a single via connecting said RWL to said shared read gate connection element.

20. The gain cell of claim 18, wherein a gate element of said write transistor is a shared write gate connection element extending from said footprint area of said gain cell into a footprint area of a second adjacent gain cell in said same column said second adjacent gain cell located on a different side of said gain cell to said first gain cell of said column.

21. The gain cell of claim 18, comprising a via connecting said WWL to said shared write gate connection element.

22. The gain cell of claim 1, wherein said at least one transistor of said write element comprises a transistor having a first doping type; and wherein said at least one transistor of said read element comprises two transistors having a second doping type which is different to said first doping type.

23. The gain cell of claim 1, wherein said at least one transistor of said write element comprises a p-type transistor; and wherein said at least one transistor of said read element comprises two n-type transistors.

24. The gain cell of claim 7, wherein each of said read transistor, said write transistor and said storage transistor comprise gate connection elements which each occupy different regions of said footprint area of said gain cell without overlapping.

* * * * *